US006960923B2

(12) United States Patent
Eldridge et al.

(10) Patent No.: US 6,960,923 B2
(45) Date of Patent: Nov. 1, 2005

(54) PROBE CARD COVERING SYSTEM AND METHOD

(75) Inventors: Benjamin N. Eldridge, Danville, CA (US); Carl V. Reynolds, Pleasanton, CA (US)

(73) Assignee: FormFactor, Inc., Livermore, CA (US)

( * ) Notice: Subject to any disclaimer, the term of this patent is extended or adjusted under 35 U.S.C. 154(b) by 210 days.

(21) Appl. No.: 10/025,303

(22) Filed: Dec. 19, 2001

(65) Prior Publication Data

US 2003/0112001 A1 Jun. 19, 2003

(51) Int. Cl.[7] ............................................... G01R 31/02
(52) U.S. Cl. ..................... 324/754; 439/135; 439/136
(58) Field of Search ............................... 439/136, 135; 324/754, 761, 158.1

(56) References Cited

U.S. PATENT DOCUMENTS

| | | | |
|---|---|---|---|
| 4,176,897 A | * 12/1979 | Cameron | |
| 4,232,928 A | * 11/1980 | Wickersham | 439/42 |
| 4,268,102 A | * 5/1981 | Grabbe | |
| 4,396,935 A | * 8/1983 | Schuck | |
| 4,782,289 A | * 11/1988 | Schwar et al. | |
| 5,406,211 A | * 4/1995 | Inoue et al. | 324/758 |
| 5,436,567 A | * 7/1995 | Wexler et al. | 324/754 |
| 5,577,819 A | * 11/1996 | Olsen | 312/242 |
| 5,640,100 A | 6/1997 | Yamagata et al. | 324/754 |
| 5,695,068 A | 12/1997 | Hart et al. | 206/725 |
| 5,729,149 A | * 3/1998 | Bradshaw et al. | 324/758 |
| 5,756,937 A | * 5/1998 | Gleadall | 174/138 F |
| 5,917,707 A | 6/1999 | Khandros et al. | 361/776 |
| 5,974,662 A | 11/1999 | Eldridge et al. | |
| 5,990,692 A | * 11/1999 | Jeong et al. | 324/755 |
| 6,184,053 B1 | 2/2001 | Eldridge et al. | 438/52 |
| 6,305,076 B1 | * 10/2001 | Bright | 29/837 |
| 6,316,954 B1 | * 11/2001 | Venaleck | 324/761 |

FOREIGN PATENT DOCUMENTS

| | | |
|---|---|---|
| DE | 19733861 | 2/1999 |
| EP | 046091 | 12/1991 |
| JP | 1-140071 | * 6/1989 |
| JP | 2-254367 | * 10/1990 |
| JP | 11-074322 | 3/1999 |
| WO | WO 00/33089 | 6/2000 |

* cited by examiner

*Primary Examiner*—Neil Abrams
(74) *Attorney, Agent, or Firm*—N. Kenneth Burraston

(57) ABSTRACT

A probe card covering system includes a probe card for testing a die on a wafer, the probe card having contacts adapted for electrical engagement with the die; a removable cover connected to the probe card and positionable in a first position over the contacts of the probe card, the cover being movable to a second position exposing said contacts for the engagement with the die; and, wherein the cover is movable from the first position to the second position while the probe card is located in a wafer testing machine.

58 Claims, 19 Drawing Sheets

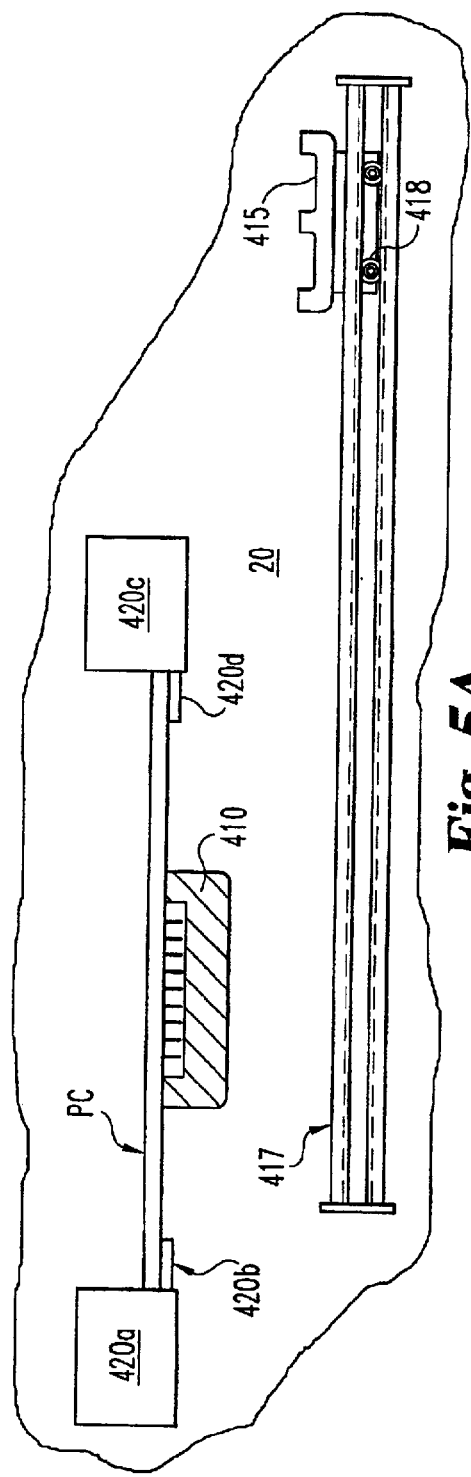
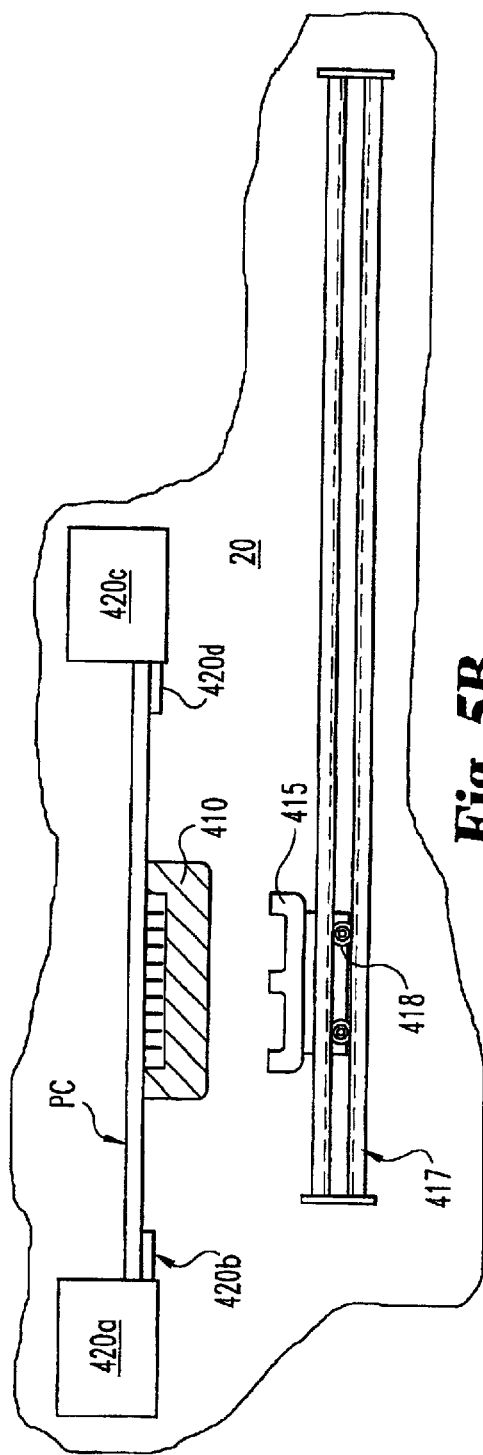
*Fig. 5A*
*Fig. 5B*

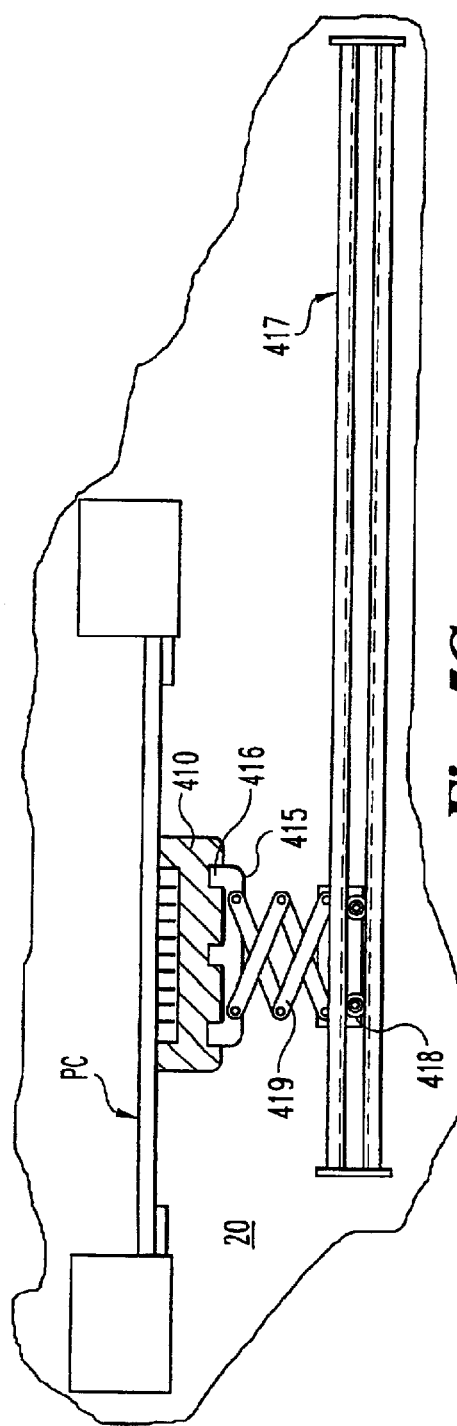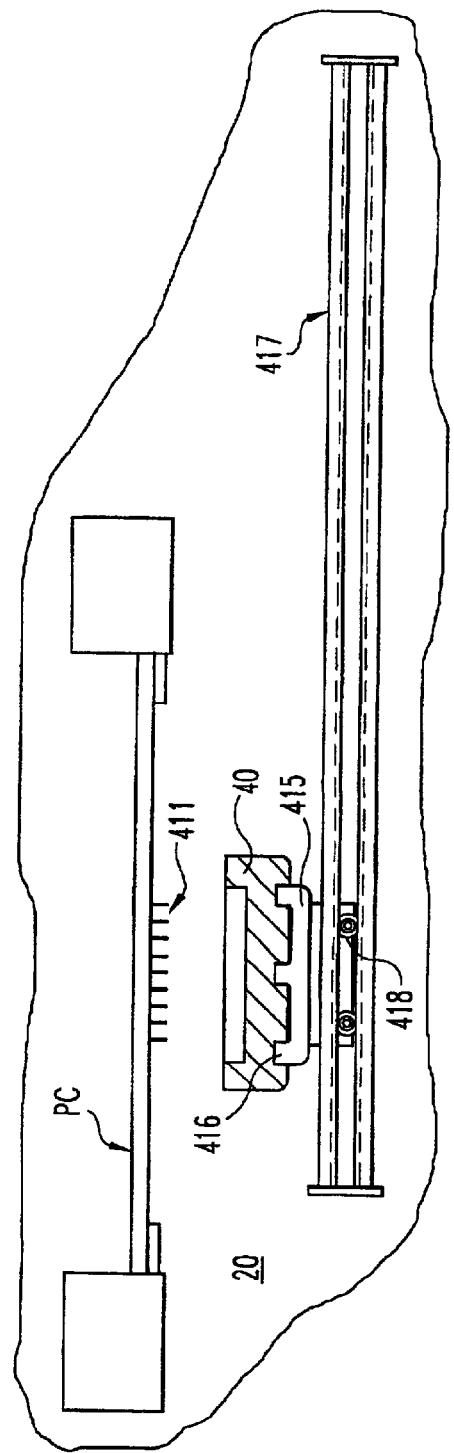

PROBE CARD COVERING SYSTEM AND METHOD

BACKGROUND OF THE INVENTION

The present invention relates to probe cards having electrical contacts for testing integrated circuits, and more specifically for a covering system and method to protect those electrical contacts. Probe cards are used in testing a die, e.g. integrated circuit devices, typically on wafer boards. Such probe cards are used in connection with a device known as a tester (sometimes called a prober) wherein the probe card is electronically connected to the tester device, and in turn the probe card is also in electronic contact with the integrated circuit to be tested. One example of such prober/tester is shown in U.S. Pat. No. 5,640,100 (incorporated herein by reference). Other testers may be modified and used in connection with the present invention as well.

The probe card has electrical contacts for contacting discrete portions of the integrated circuit to conduct electrical signal testing of the circuit. Such contacts typically are in the form of microsprings. For example, such contacts are disclosed in U.S. Pat. Nos. 6,184,053 B1, 5,974,662 and 5,917,707.

Such electrical contacts, while robust in use, are somewhat fragile and can be subject to damage or deflection by unintended physical contact or otherwise. Probe cards have been shown protected with a packaging system, such as packaging/shipping covers as disclosed in U.S. Pat. No. 5,695,068.

SUMMARY OF THE INVENTION

The invention is set forth in the claims below, and the following is not in any way to limit, define or otherwise establish the scope of legal protection. In general terms, the present invention relates to a cover for the electrical contacts for probe cards. The cover, alone or in combination with the probe card and/or alone in combination with the tester and/or a method thereof covers the electrical contacts, thereby protecting them. The cover is removable within and/or as a part of the testing machine itself, thereby protecting the electrical contacts even when they are being unpackaged and loaded into the testing machine.

One object of the present invention is to provide a cover for probe card electrical contacts. This and other objects may be discerned from the present disclosure.

BRIEF DESCRIPTION OF THE DRAWINGS

FIGS. 5A–5E is a side diagrammatic view inside a tester showing another embodiment of the present invention.

DESCRIPTION OF THE PREFERRED EMBODIMENTS

Figure 1:
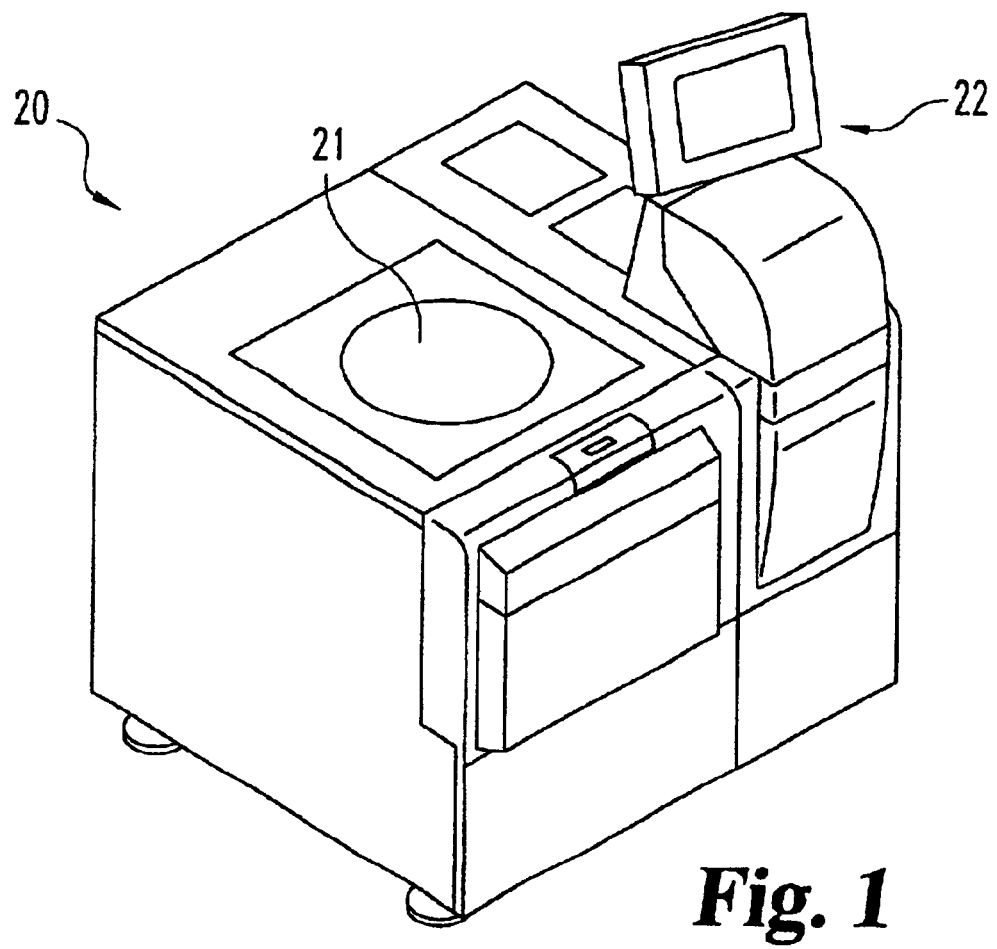
FIG. 1 is a top perspective view of one example of a testing machine used according to the present invention.

For the purposes of promoting an understanding of the principles of the invention, reference will now be made to the embodiments illustrated in the drawings and specific language will be used to describe the same. It will nevertheless be understood that no limitation of the scope of the invention is thereby intended, and alterations and modifications in the illustrated device and method and further applications of the principles of the invention as illustrated therein, are herein contemplated as would normally occur to one skilled in the art to which the invention relates.

FIG. 1 shows a typical example of a wafer prober 20 usable in connection with the present invention. Tester 20 typically includes an access opening 21 for mounting the probe card inside the tester. Control panel 22 allows for operator control of the testing process. Semiconductor wafers are also loaded into the wafer prober 20, often times in a "boat" or cassette which allows several wafers to be held for testing sequentially by contact with the probe card.

Figure 2:
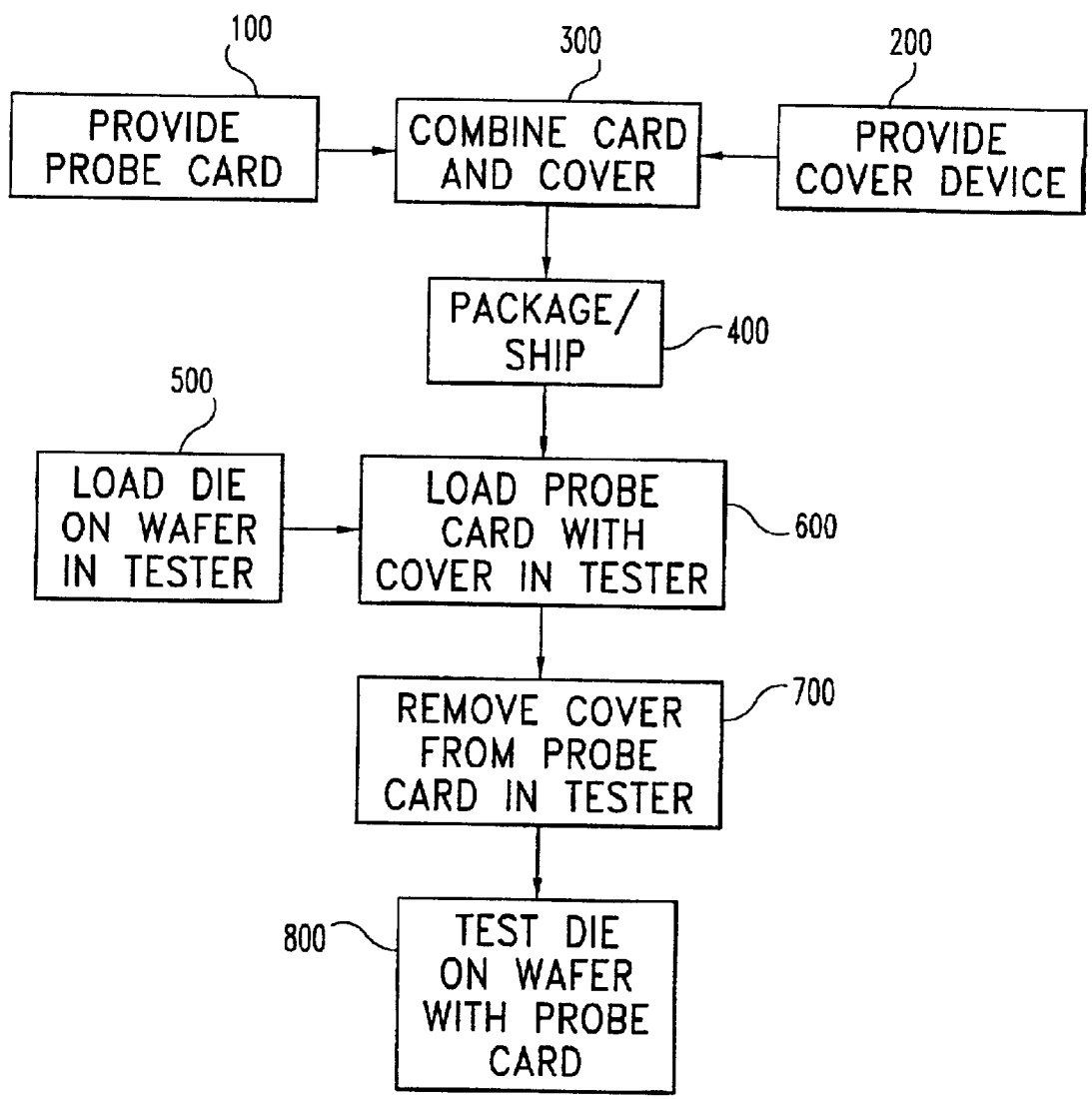
FIG. 2 is an exemplary flowchart showing one method according to the present invention.

FIG. 2 illustrates an exemplary flowchart regarding one aspect of the present invention. As illustrated, a probe card is provided at act 100 and the cover device provided at act 200, with the two being combined at act 300. Acts 100, 200, and 300 may occur separately or simultaneously as part of the manufacturing process for creation of the probe card and cover. Typically thereafter the probe card with the cover is packaged and/or shipped at act 400 to the user of the probe card. Such user loads the probe card in a testing device, such as tester 20, at act 600 and loads the wafers in the tester at act 500. Thereafter, with the probe card loaded in the tester, the act of removing the cover from the probe card occurs. This is typically performed by automated and/or robotic mechanisms built into the tester such as, and without limitation, such devices described below as well as hybridization of the various systems disclosed below. Thereafter, the wafer is mated to the probe card, testing the wafer with the probe card at act 800.

Figure 3A:
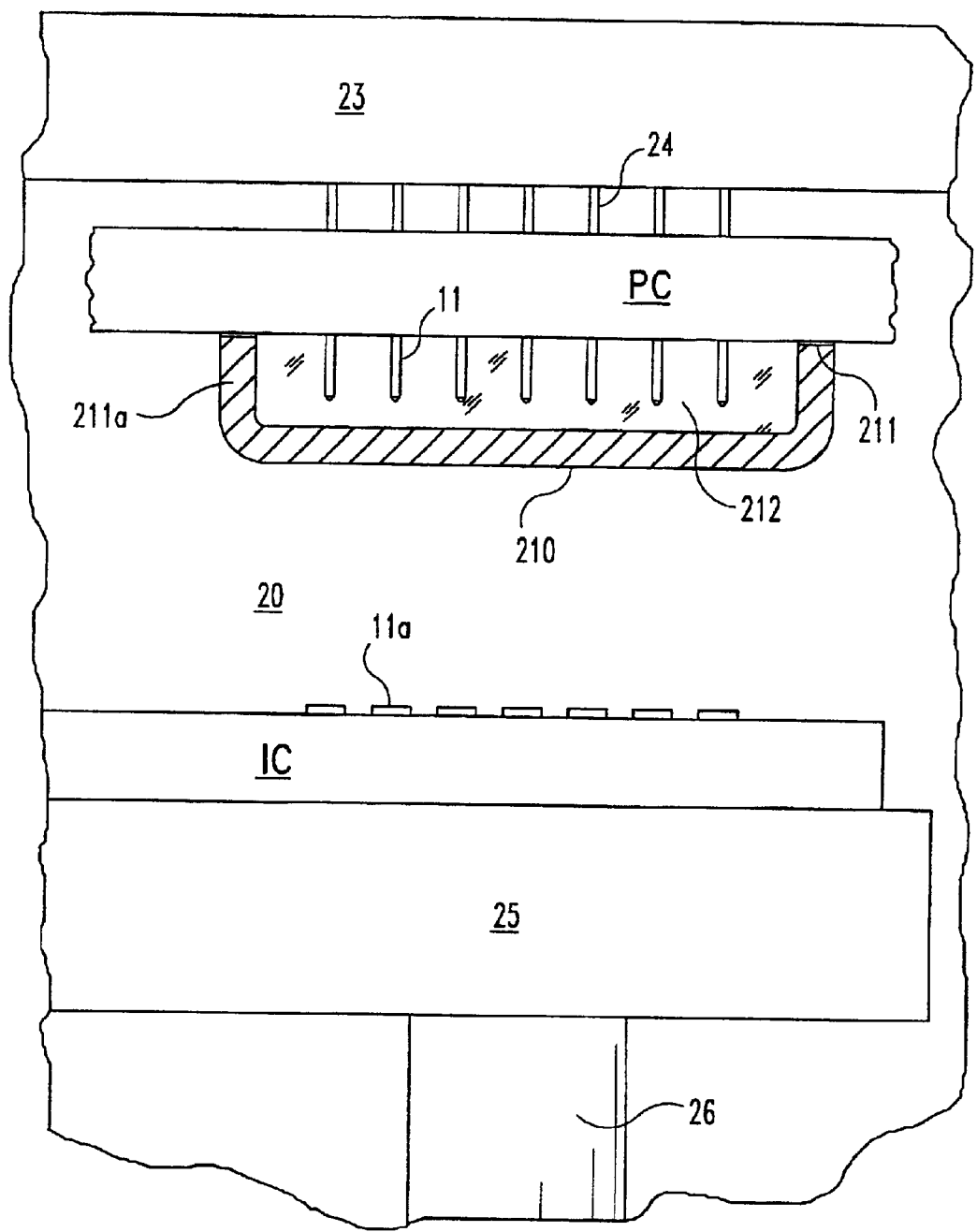
FIGS. 3A–3E are side diagrammatic views of one embodiment in the present invention showing steps in sequence removing a cover from contacts of a probe card.

FIGS. 3A–3F are but one example of the present invention. Referring to FIG. 3A, this drawing illustrates the inside of tester 20. Therein, probe card PC is mounted in the tester parallel to the die on a wafer (integrated circuit IC), and most typically positioned directly above it. The probe card has electrical contacts, such as contact 11, as known in the industry. For example, such contacts are generally the type disclosed in U.S. Pat. Nos. 6,184,053 B1; 5,974,662; and 5,917,707 which are hereby incorporated by reference. Other contacts known in the industry may be included in any embodiment of the probe cards of the present invention. Typically, the probe card is connected to the testing machine by other electrical contacts, as diagrammatically illustrated with test head 23 directly connected with connections 24 to the probe card PC. Wafer chuck 25 includes table actuator 26 to lift the integrated circuit IC vertically in the Z-axis direction (see FIGS. 3E, 3F) to allow electronic contact between contacts 11 and a pad (such as pad 11a) of integrated circuit IC forming contact points.

To allow for such contact, cover 210 is removed to expose electrical contacts extending from the flat bottom surface of the probe card. As shown in FIG. 3A, cover 210 encloses the contacts within a space 212. That space is partially defined by a skirt or flange 211a. Preferably, space 212, as well as the interior surfaces of the cover, have a high degree of cleanliness, preferably less than about 10,000 parts per million of particular matter (1 micron or greater in diameter), and more preferably less than 1,000 parts per million, and preferably still less than 100 parts per million of particulate greater than 1 micron in diameter.

Cover 210 may be attached to the probe card in a variety of ways. For example, contact 211 may comprise a metal contact including magnets on the probe card, magnets on the cover, both, and corresponding ferro-magnetic surfaces to hold the cover in place. Alternatively, contact 211 may be adhesive, such as a temporary contact adhesive which, upon application of Z-axis axial force of the cover may separate the cover from the probe card. Other attachment mechanisms may be used as well, including bayonet mounts, thread mounts, snap fit and/or other detent mounts and otherwise.

Figure 3B:
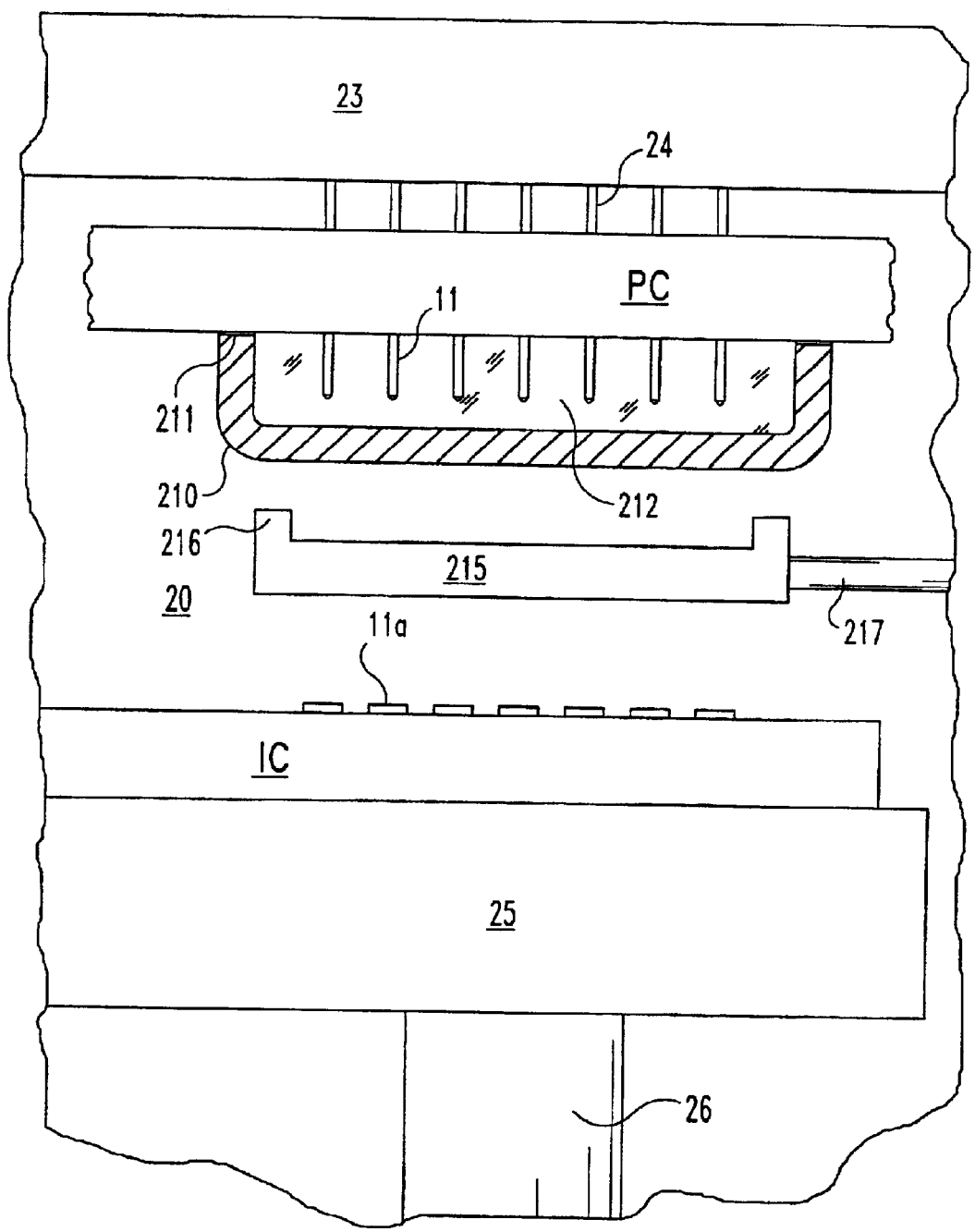
Figure 3C:
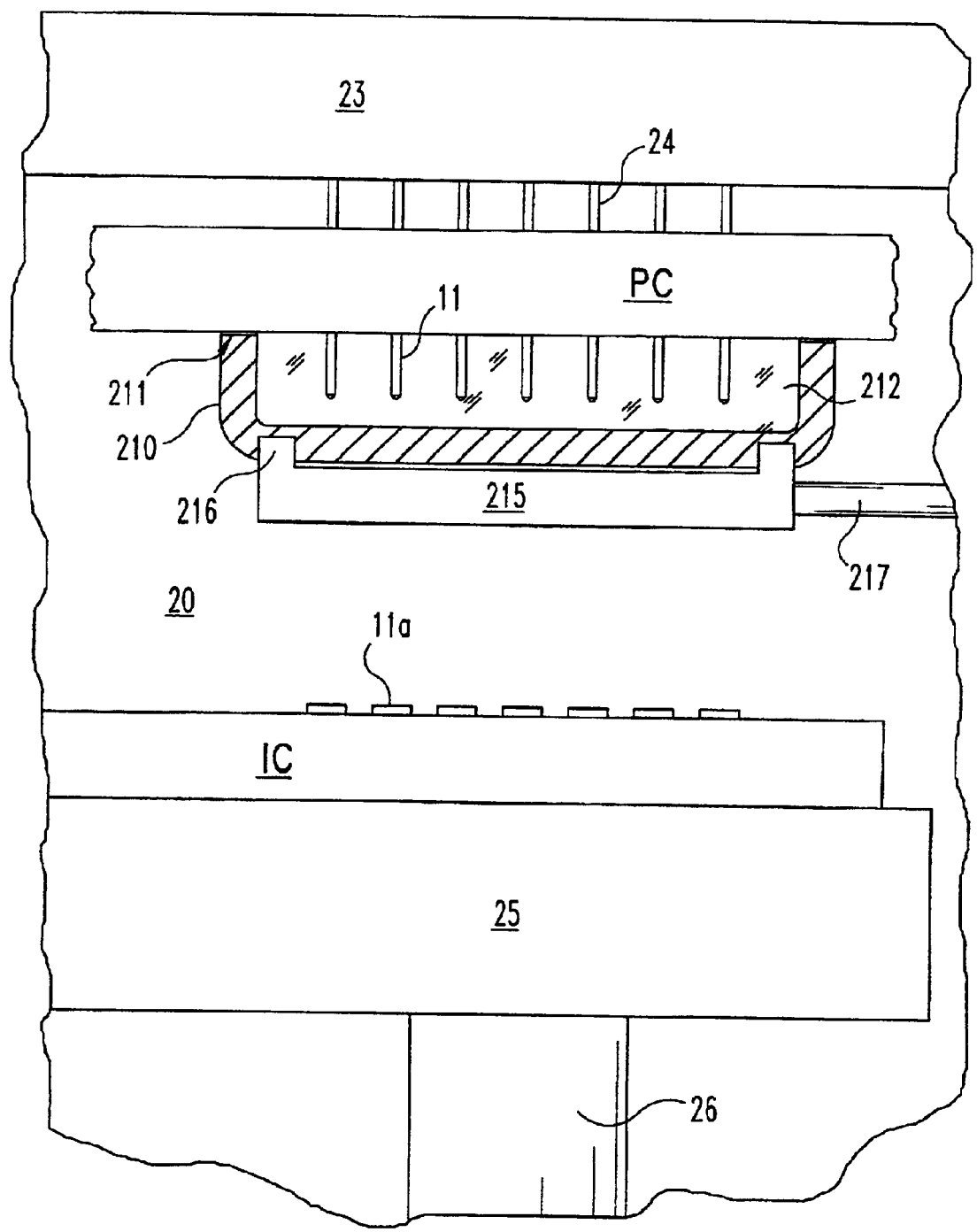
Figure 3D:
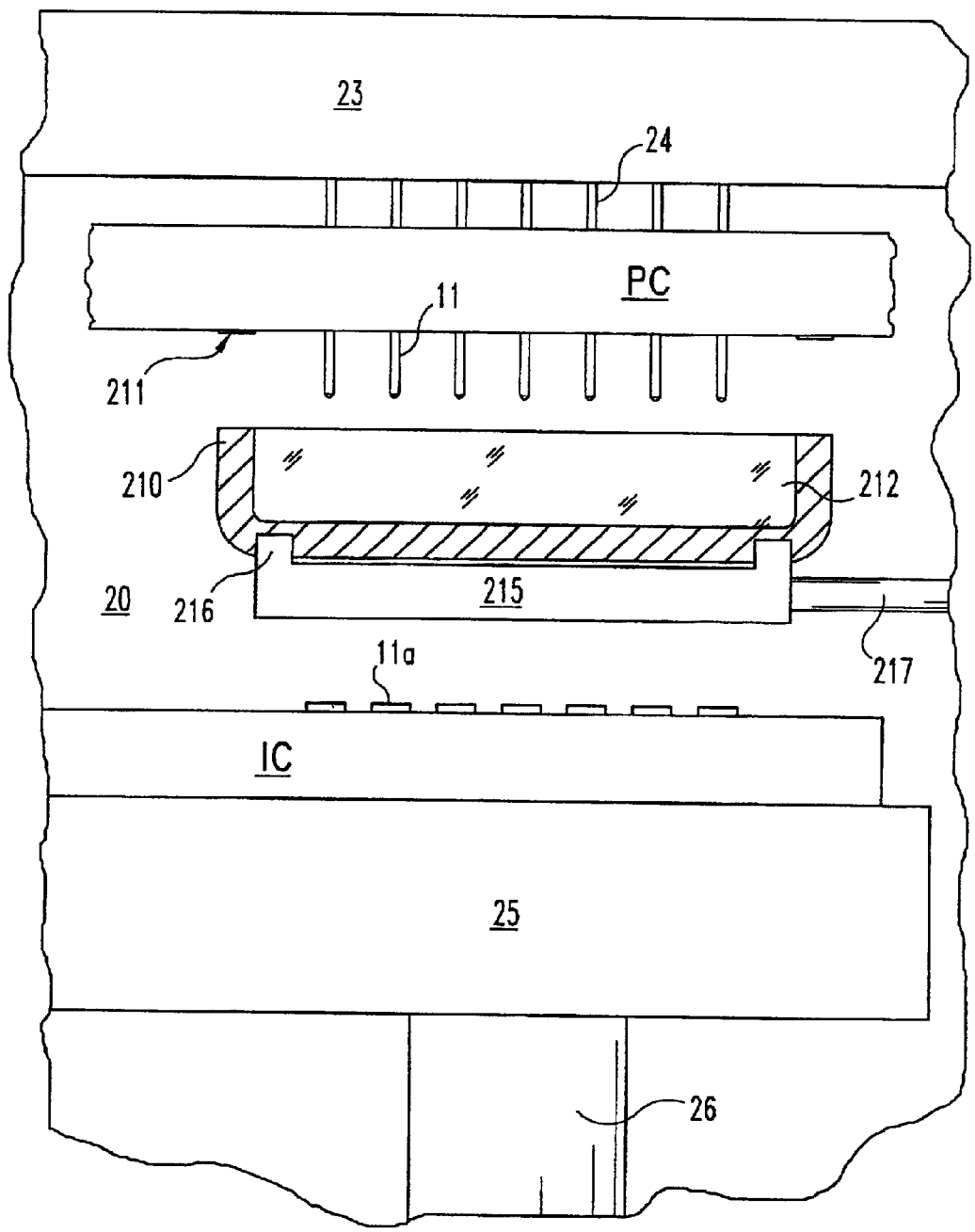
Figure 3E:
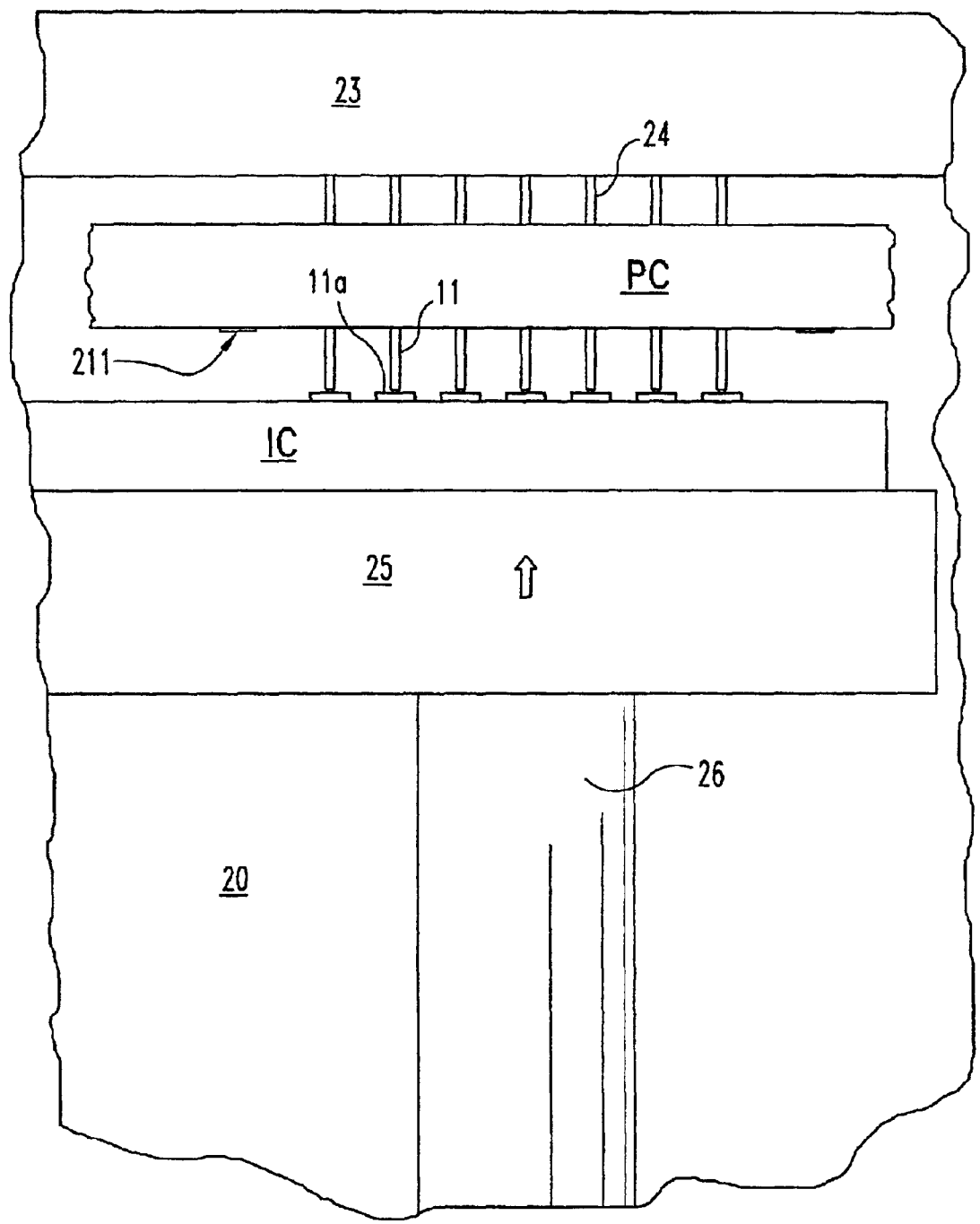
Figure 3F:
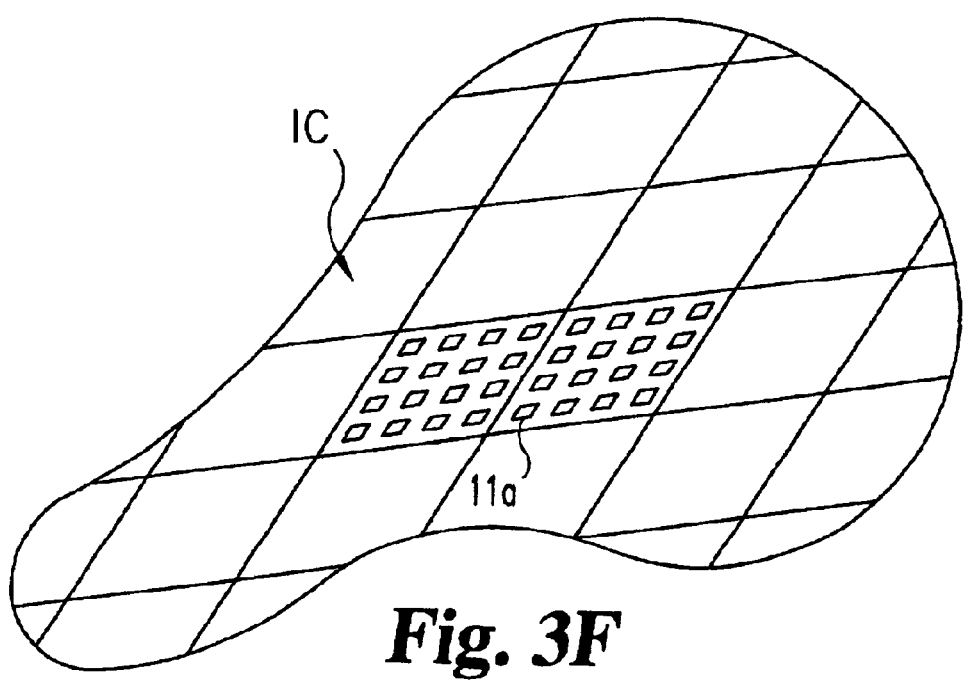
FIG. 3F is a perspective view of pads on wafer board.

Referring to FIG. 3B, the system of FIG. 3A is shown with holder 215 moved into position along a transverse horizontal X-axis by actuator arm 217. Holder 215 preferably includes holder elements such as element 216 to hold cover 210. Such elements may take a variety of shapes, and preferably engage one or more surfaces on the holder. For example, as illustrated in FIGS. 3C and 3D, elements 216 grab the outside perimeter of cover 210. The holder element may be magnetic. Also, alternatively, as discussed below and otherwise, such holders may engage recesses or other surfaces in or on the cover to facilitate holding the cover and removing it from the probe card. After grabbing the cover 210 (FIG. 3C), in this particular embodiment arm 217 and holder 215 retract downwardly in the Z-axis, thereby removing the cover below the probe card and clearing the contacts 211. Thereafter, they are moved out of the way, typically in a horizontal X-axis direction, or by swinging an arcuate path, or otherwise, so that the integrated circuit IC (on the semiconductor wafer) and probe card PC may be brought together in engagement illustrated in FIG. 3E. Thereafter, the electronic testing in the integrated circuits through the probe card and testing device 20 is accomplished.

Figure 4A:
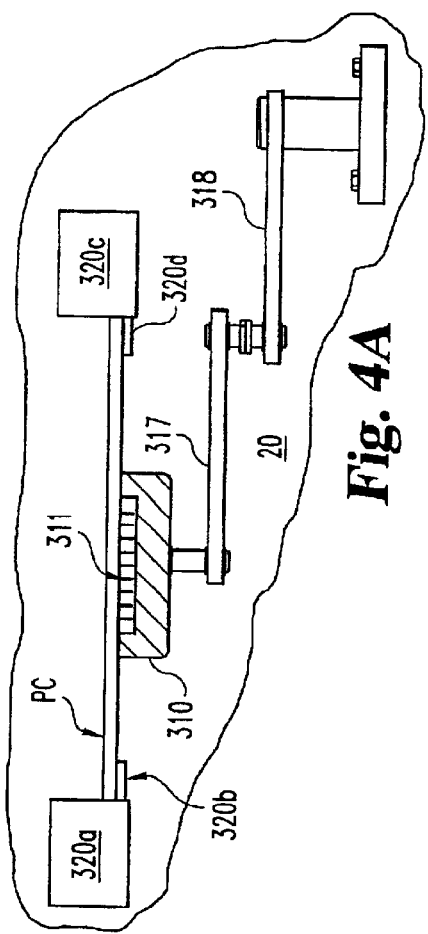
FIGS. 4A and 4B are a side diagrammatic view of another embodiment of the present invention.
Figure 4B:
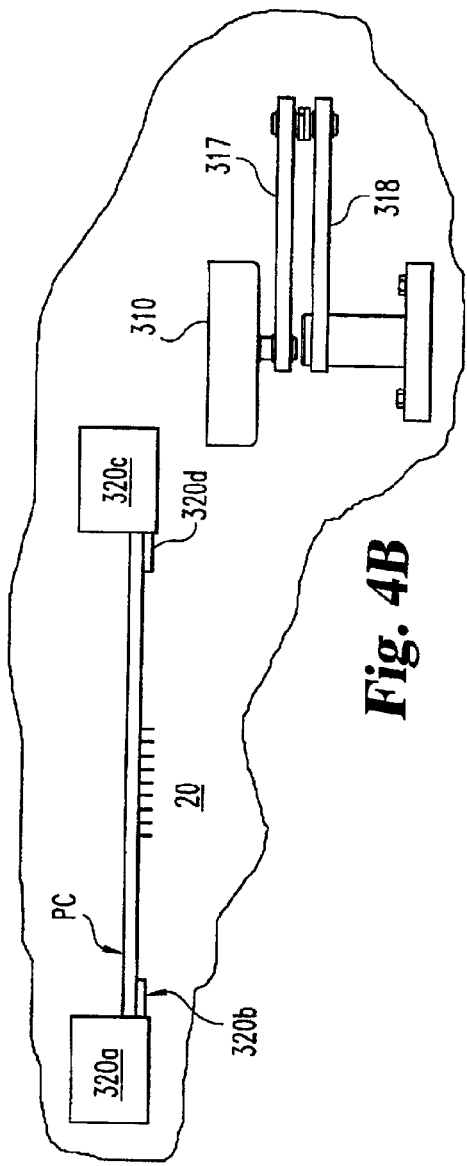

FIGS. 4A and 4B disclose an alternative embodiment utilizing cover 310 on probe card PC. As illustrated, arms 317 and 318 swivel in a position along the X-axis (and the Y-axis) through arcuate movement under the electrical contacts 311 of the probe card (FIG. 4A). As part of this, there is also vertical movement to have holder 316 engage or otherwise hold cover 310 by mechanical robotic action, such as telescoping action, rack gear, or otherwise. The holder is withdrawn in the vertical Z-axis retracted away from the probe card as illustrated in FIG. 4B. The probe card is held within the tester 20 by mounts such as 320a, 320b, 320c, and 320d in the testing machine.

Figure 5E:
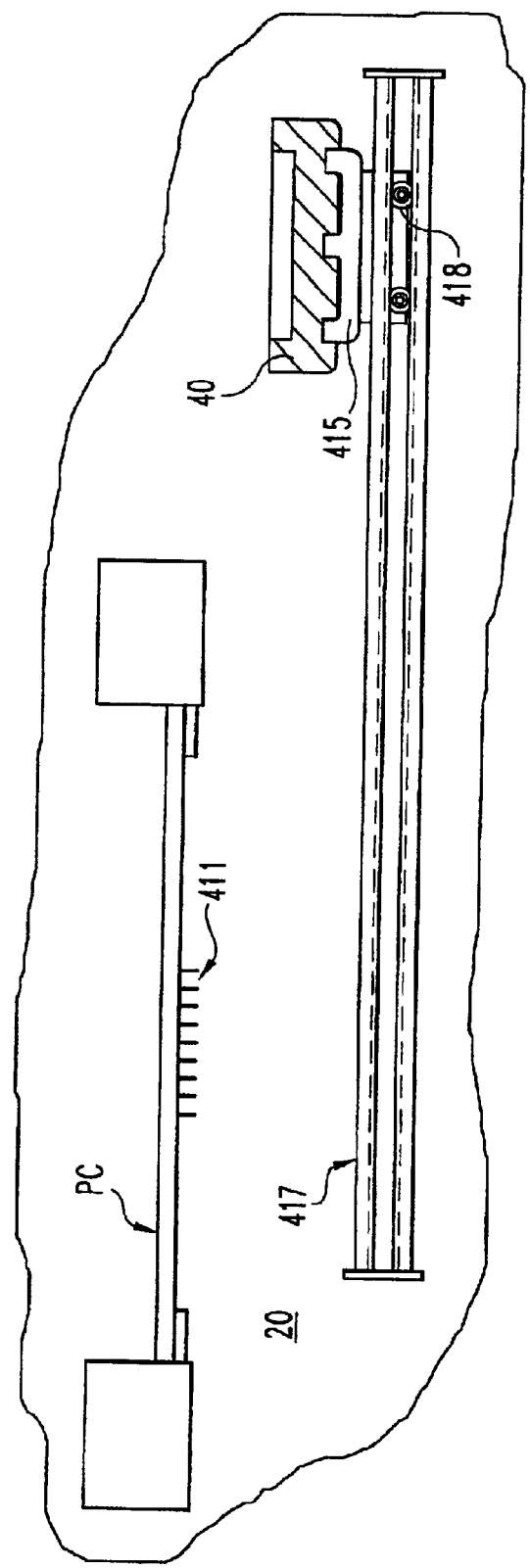

Referring to FIGS. 5A, 5B, 5C, 5D and 5E, these drawings show an alternative arrangement of the present invention sequentially inside testing device 20. Probe card PC is mounted in mounts 420a, 420b, 420c and 420d in the tester. Electrical contacts, such as contacts 411 are oriented downwardly in a Z-axis direction along the bottom surface of the probe card which ordinarily is flat planar surface. Holder 415 is provided on the carriage mechanism along guide rails 417. Casters 418 or other low friction engagement with guide 417 are provided to allow movement from a first position (FIG. 5A) to a second position (FIG. 5B) along guide 417. Typically, guides 417 comprise a pair of such guides in parallel arrangement spaced far enough apart in the Y-axis direction (in and out of the page) such that when the cover is removed (FIG. 5E) the guides 417 do not interfere with the upward movement of the table and integrated circuit (of the type shown as table 25 in FIG. 3E) to allow for testing of the integrated circuit. As shown in FIG. 5C, holder 415 preferably is moved in position, preferably with vertical movement in the Z-axis so that holder elements 416 grab any one of a number of mechanical and/or other mechanisms to hold cover 410. As illustrated in FIG. 5C, such lifting mechanism may have a scissor mechanism 419, although telescoping action, lever action, thread action, cam action and other lifting mechanisms may be used. Such lifting mechanism, as with the other movements in the other embodiments, may be actuated by a variety of mechanisms such as pneumatics, stepper motors, servo motors or other electrical motors or otherwise. In addition, the carriage mechanism with holder 415 and scissor mechanism 419 can be moved along guide 417 by such means as well.

After holder 415 grabs cover 410, as illustrated in FIG. 5D, holder 415 retracts downwardly in the Z-axis. Thereafter, holder 415 is moved transversely out of the way such as, for example, along an X-axis parallel with guide 417. As shown in FIG. 5E, when holder 415 and cover 410 are moved out of the way, microspring contacts, or other such contacts, on the underside of the probe card are now exposed and ready for engagement and testing of an integrated circuit.

According to FIGS. 6A–6D, FIGS. 7A–7B, and FIGS. 8A–8B, the present invention may alternatively include a cover mechanism which, when combined with the probe card PC, is integrally formed as a part of the probe card, rather than having the cover completely removed as described with the previous examples. More specifically, referring to FIGS. 6A, 6B, 6C, and 6D, cover 510 is provided covering electrical contacts, such as contacts 511. The cover is moveable between a first position (FIG. 6A) and the second position (FIG. 6B) to expose the electrical contacts of the probe card PC. Cover 510 may comprise any number of shapes and is, for example, illustrated here as being square in shape but may be round or otherwise. As illustrated, cover 510 is moveable by sliding along tracks or guides 517a and 517b which, in the preferred and illustrated version, are parallel and linear, although they may be nonlinear or otherwise. Tracks may be fixed to and/or formed as a part of the probe card, and may be machined slots in the probe card as illustrated in this one example. In place of tracks, rollers may be incorporated to allow movement of the cover 510 from the first position (FIG. 6A) to the second position (6B).

Figure 6A:
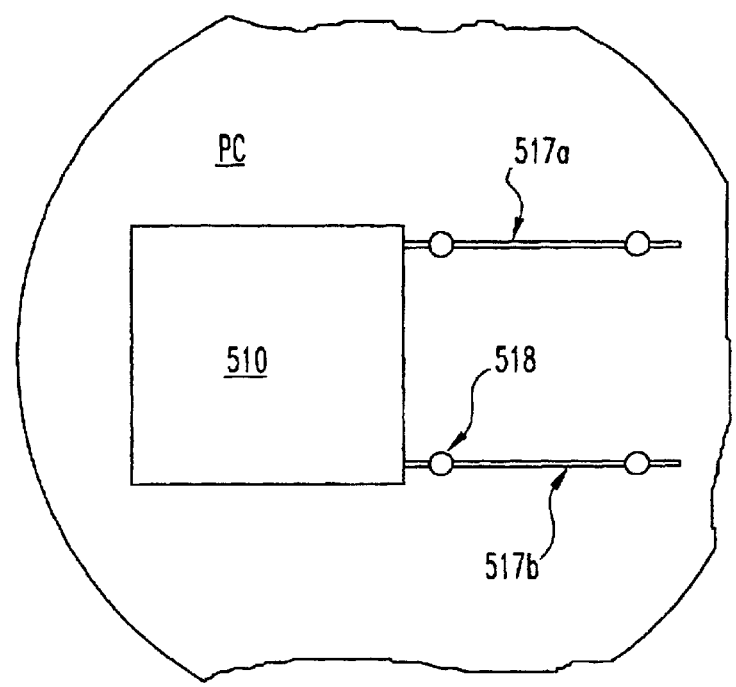
FIGS. 6A–6B is a bottom plan view of another embodiment of the present invention.
Figure 6B:
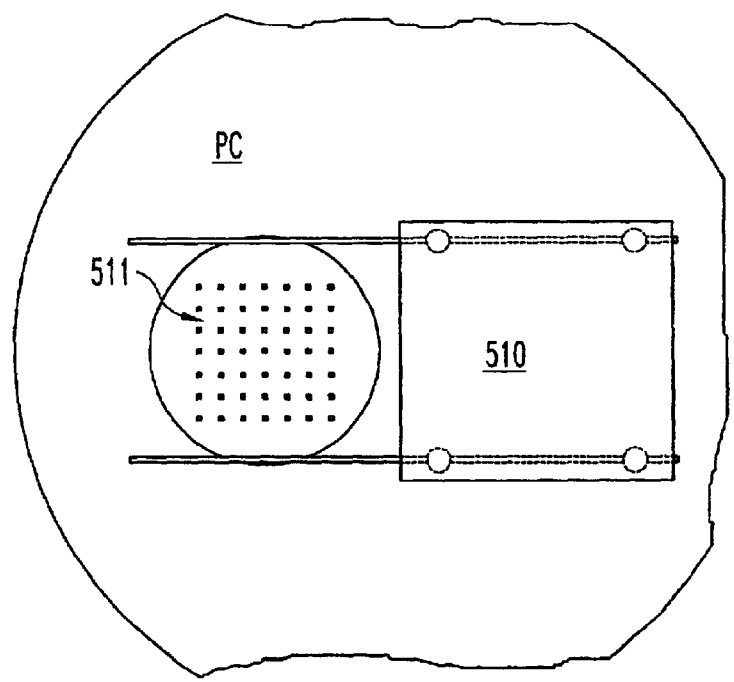
Figure 6C:
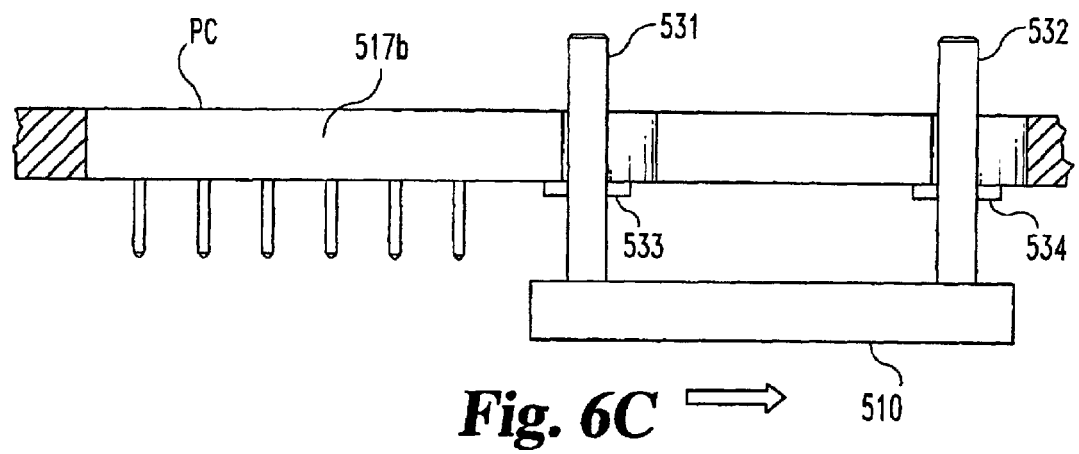
FIGS. 6C and 6D are partial side views of the embodiment of FIGS. 6A and 6B.
Figure 6D:
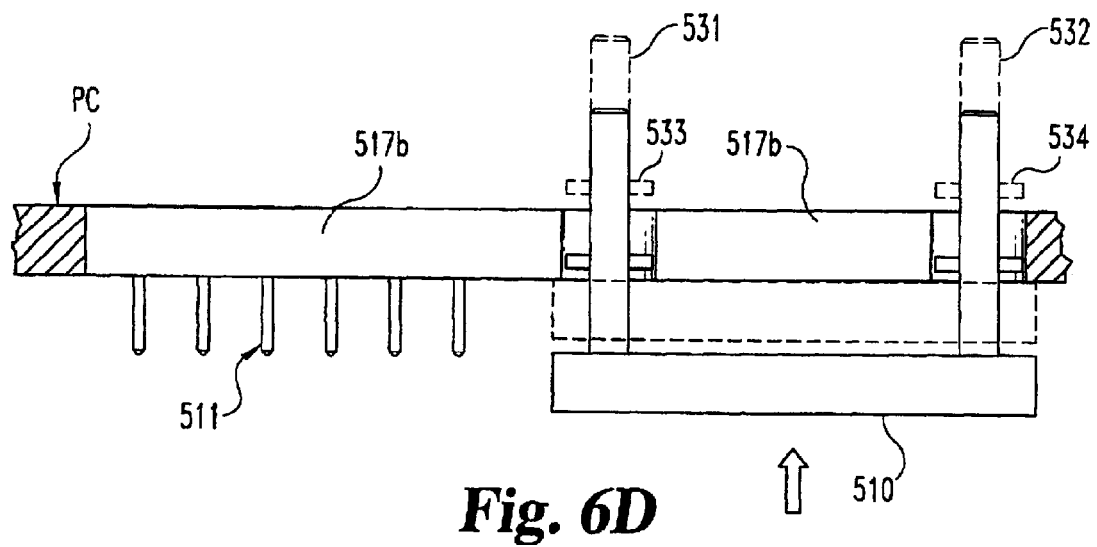

Moreover, another optional feature with such approach is to have cover 510 retractable in the Z-axis. This may be accomplished in a number of which is illustrated, it being understood that other approaches are within the present invention as well. For example, with reference to FIGS. 6C and 6D, once cover 510 is moved to the second position (slid to the far right in the drawing figures), then support struts 531 and 532 may be mechanically lifted upward once boss 533 and boss 534 are in alignment with corresponding openings, such as opening 518. Such bosses maintain cover 510 clear of contacts 511 while the cover is in the first position. Yet, the openings, such as opening 518, allow the bosses to pass there through in a Z-axis direction. Accordingly, as illustrated in the phantom lines of FIGS. 6D showing the retracted position, the Z-axis thickness of cover 510 is preferably less than the Z-axis height of the electrical contacts. Retracting the cover out of the way of the contacts avoids interference when the contacts electronically engage the integrated circuit to be tested. It should be noted that alternative arrangements of sliding cover 510 may be provided. For example, although FIGS. 6A–6D illustrate a single sliding cover, this may be modified to have two or more sliding covers. For example, there may be two sliding covers, a left-half cover and a right-half cover with each of them moving between a first position (covering the electrical contacts) and the second position (exposing the electrical contacts) in which the two cover halves move in opposite directions. Other mechanisms may be provided where more than two cover components move to expose the contacts by movement in radiating directions away from the electrical contacts.

Figure 7A:
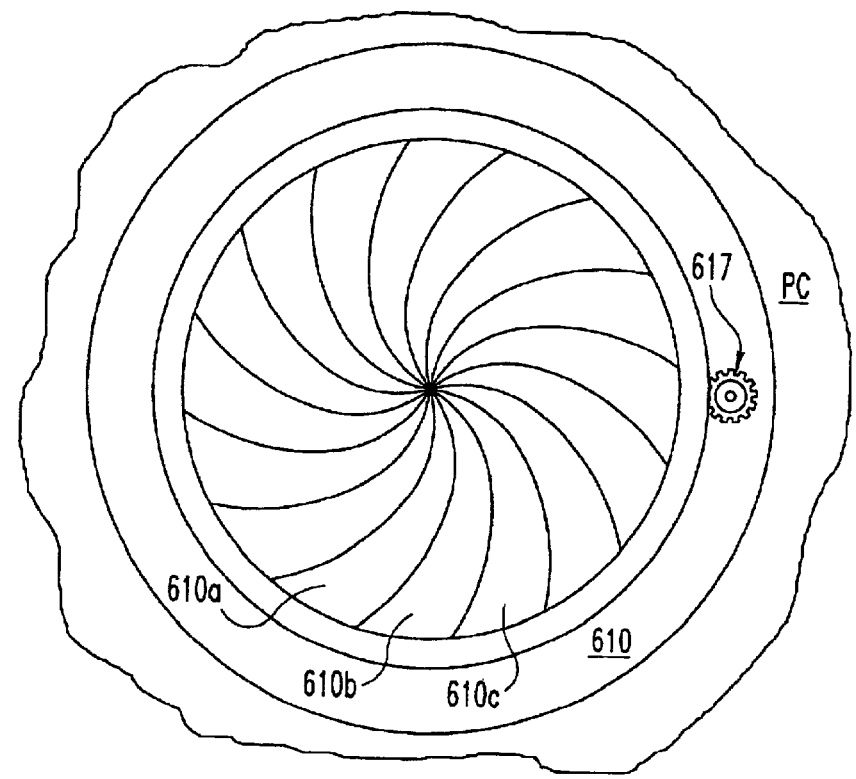
FIG. 7A is a bottom plan view of another embodiment of the present invention with the cover closed.
Figure 7B:
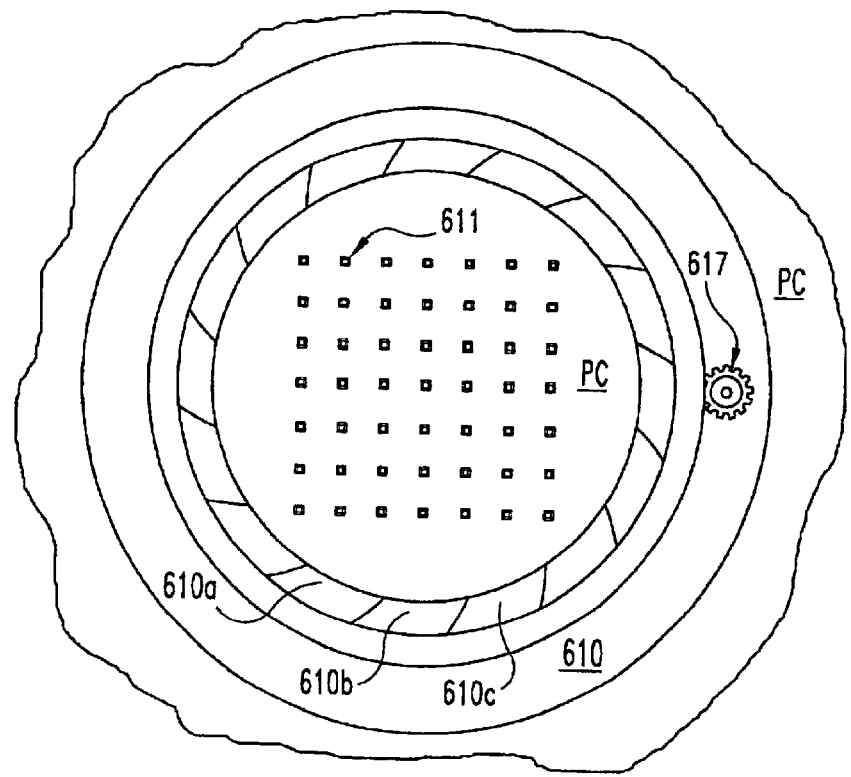
FIG. 7B is a bottom plan view of the device of FIG. 7A with the cover open.

Referring to FIGS. 7A and 7B, an alternative arrangement is provided with cover 610. Cover 610 is mechanically configured like an aperture of a photographic camera. The aperture has several sheaves, such as sheaves 610a, 610b, and 610c. Cover 610 may be moved between a closed position (FIG. 7A) covering the electrical contacts of probe card PC and an open position (FIG. 7B) exposing electrical contacts 611. The actuation of this aperture movement may be done a number of ways. By way of example only, rotary gear 617 may provide rotational movement to move the aperture between an opened and closed mode. This gear may be driven by electric motors, pneumatics or otherwise as previously described. Similarly, an engagement gear may be retracted in and out of engagement with the cover of a probe card inside the testing machine 20. Alternatively, a rotating shaft and/or gear may be built into cover 610 that protrudes vertically upward through probe card PC as an actuator from the top side of the probe card. As before, cover 610 is preferably low profile, and may be arranged to be selectively retractable to facilitate the protrusion of contacts 611 for engagement with the integrated circuit. Alternatively, the diameter of the aperture mechanism cover 610 may be sufficiently great in the open mode to clear contact with the integrated circuit.

Figure 8A:
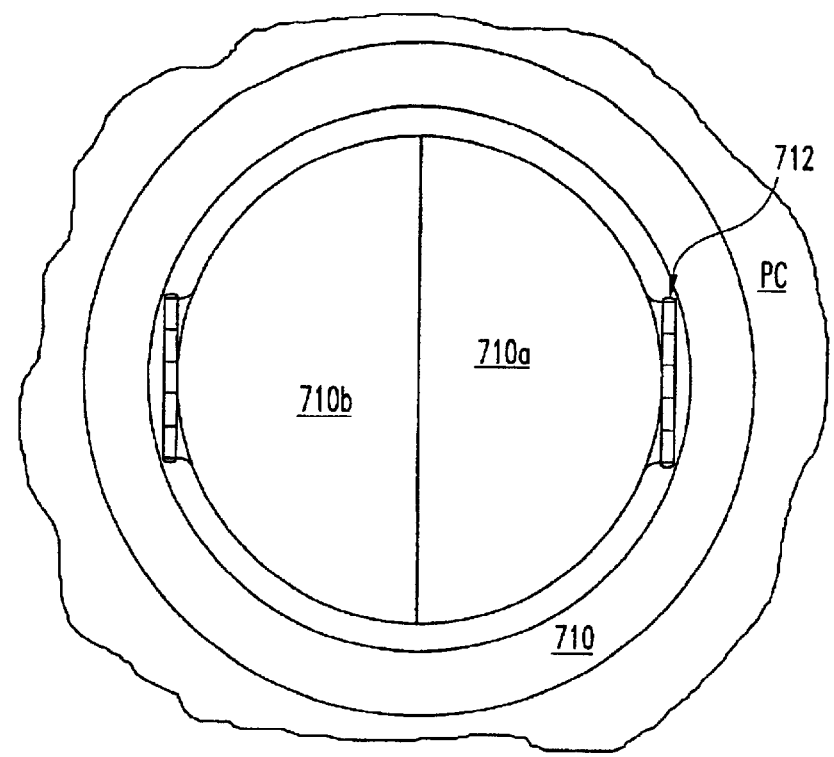
FIG. 8A is a bottom plan view of another embodiment of the present invention with the cover closed.
Figure 8B:
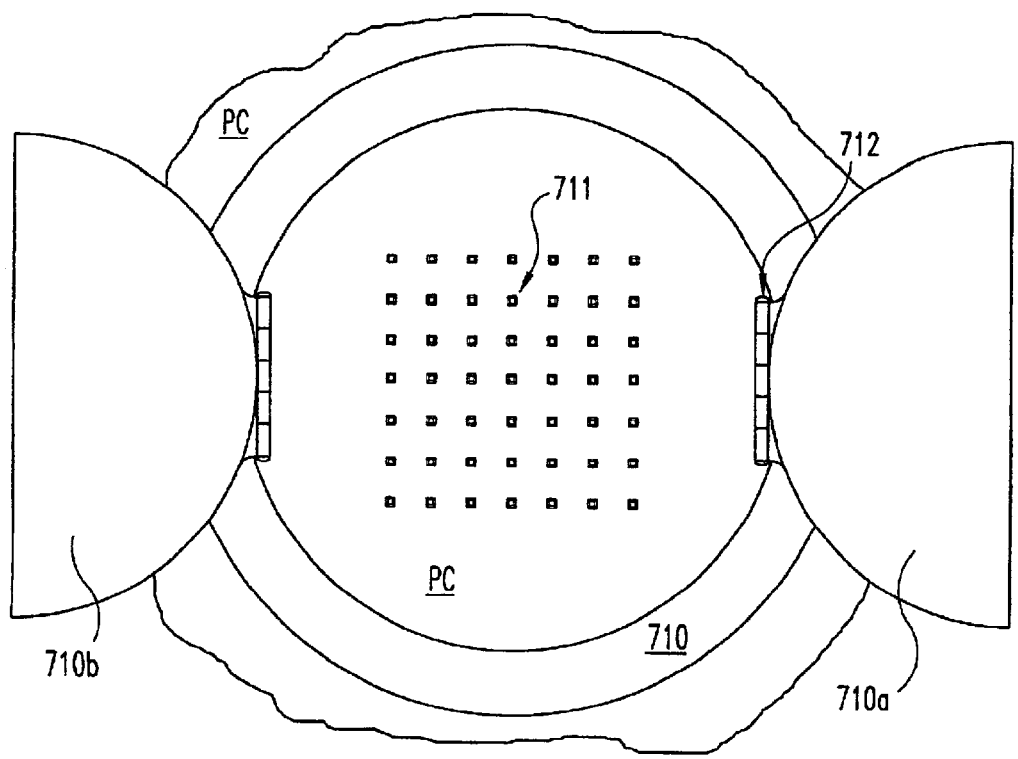
FIG. 8B is a bottom plan view of the device of FIG. 8A with the cover open.

Referring to FIGS. 8A and 8B, an alternative arrangement is illustrated in which cover 710 comprises two cover halves, 710a and 710b. The cover halves have a hinge mechanism, such as hinge mechanism 712. The cover halves move between a first closed position (FIG. 8A) and a second open position (FIG. 8B). In the open position, contacts 711 of the probe card PC are exposed for engagement and testing of an integrated circuit. Actuation of the cover halves 710a and 710b may be from a variety of mechanisms, such as a robotic arm, mechanical and/or magnetic engagement with the cover halves. Similarly, the cover halves may be held open by mechanical engagement with a lever arm, detent mechanism or magnet holder or otherwise.

Figure 9A:
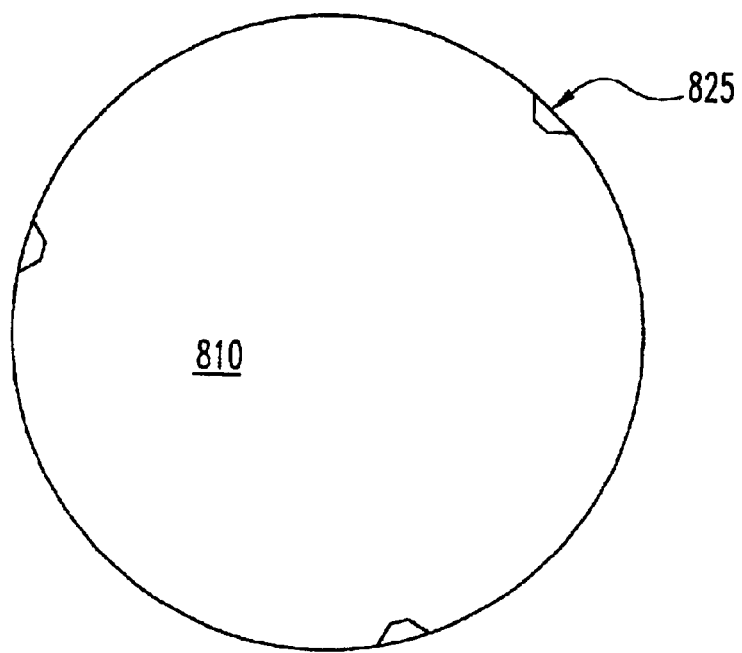
FIG. 9A is a bottom plan view of an alternative embodiment of a cover according to the present invention.
Figure 9B:
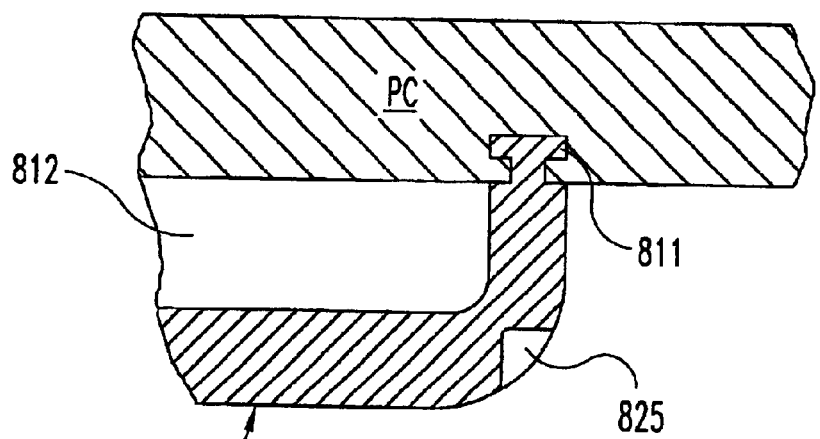
FIG. 9B is a partial side sectional view of the cover of FIG. 9A connected to a probe card.

Referring to FIGS. 9A, 9B, 10, 11, 12 and 13, some additional samples of embodiments of covers according to the present invention are illustrated. Again, these samples may be hybridized with each other and vary in shape, size, proportion and other features. For example, referring to FIGS. 9A and 9B, cover 810 is illustrated. It has one or more recesses 825 formed as circumferential recess surfaces in the cover perimeter. These surfaces provide multidimensional surfaces for engagement with the holder elements previously exemplified. Additionally, as previously mentioned, any of the covers in the present invention may be connected to probe card PC in a variety of mechanisms. This can be by way of snap fit, bayonet mount, contact adhesive, magnetic device, threading or otherwise. As illustrated in FIG. 9B, a detailed cross-sectional view, cover 810 is shown with a bayonet mount to probe card PC. A circumferential bayonet slot and corresponding bayonet tongue 811 are provided for engaging connection between the cover and the probe card. The probe card is placed in the circumferential bayonet slot, and rotated partially to lock the cover in place. As previously described, space 812 surrounds electrical contacts and preferably is maintained with the previously specified clean room standards.

Figure 10:
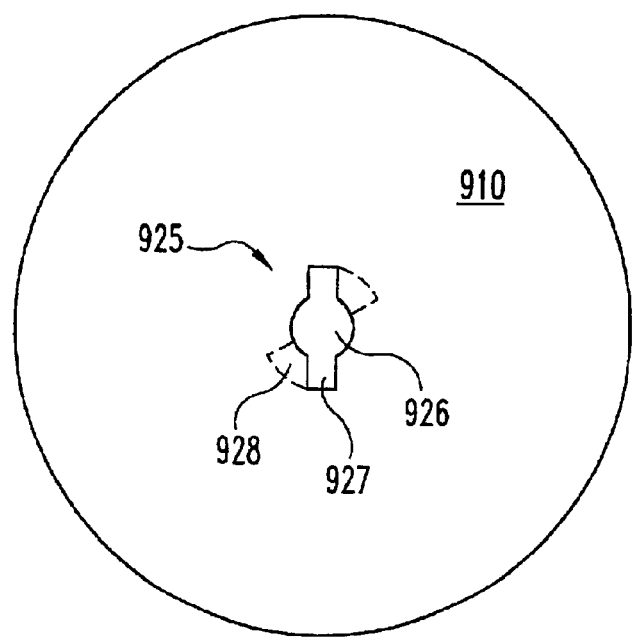
FIG. 10 is a bottom plan view of another embodiment of a cover according to the present invention.

Referring to FIG. 10, an alternative cover 910 is disclosed. This cover has formed in it a centrally located recess 925. This recess forms a key lock bayonet mount for engagement with a holder element for holding and removing the cover from the probe card contacts. Recess 925 includes a central region 926 and one or more radial regions 927. These allow a corresponding key lock to be inserted axially (typically in the Z-axis) to the prescribed depth. Thereafter, the key lock is rotated into engagement with a recess surface area 928, shown in phantom lines. In this way, the cover may be grabbed by the robotic arm or otherwise for removal.

Figure 11:
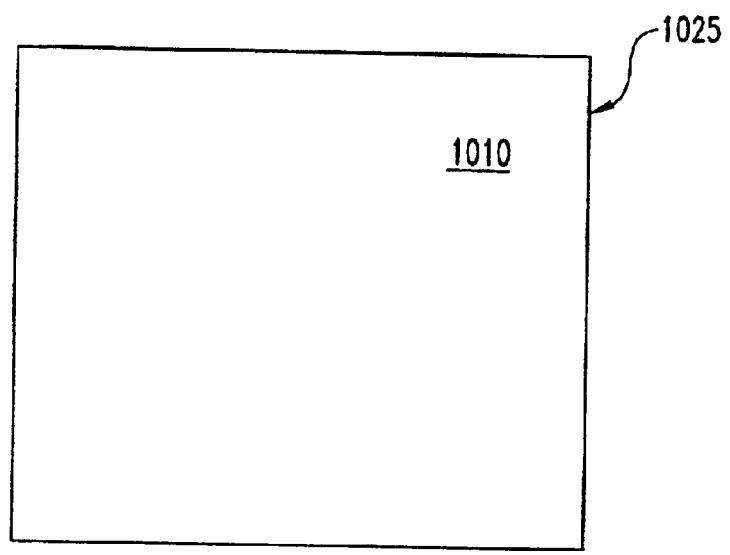
FIG. 11 is a bottom plan view of another embodiment of a cover according to the present invention.

FIG. 11 illustrates an alternative cover 1010 shown as being square in shape. It has an exterior surface 1025, and specifically includes four such surfaces, for engagement with a holder. They may hold by friction fit, jaw clamp grabbing, or otherwise. Similarly, the shape of this cover may be any shape suited to cover the contacts.

Figure 12:
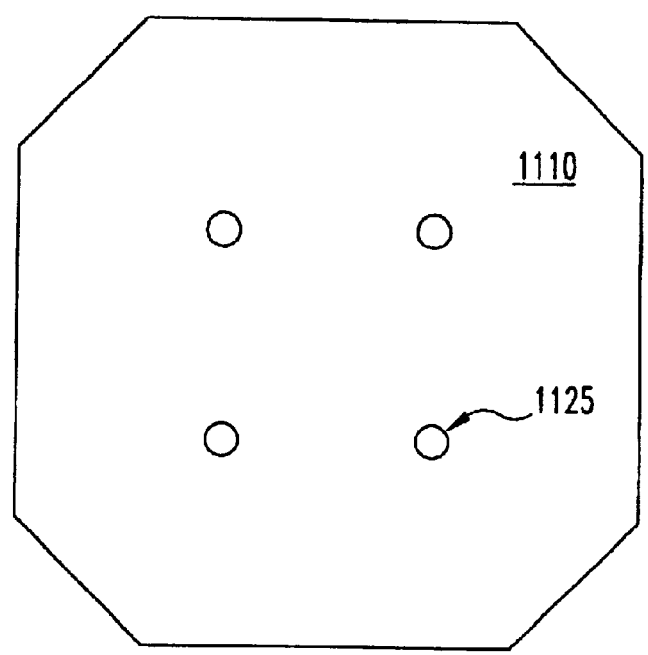
FIG. 12 is a bottom plan view of another embodiment of a cover according to the present invention.

FIG. 12 illustrates an alternative cover 1110. In this example, cover is octagonal in shape. Moreover, cover 1110 includes one or more recesses 1125. These recesses provide one or more surfaces within the cover. These recesses provide one or more surfaces for holder elements to engage and grab cover 1110 for removal and/or replacement over electrical contacts.

Figure 13:
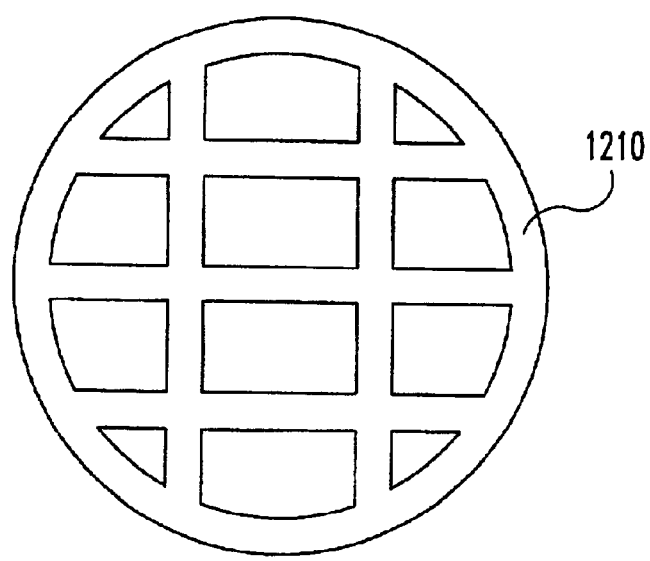
FIG. 13 is a bottom plan view of another embodiment of a cover according to the present invention.

FIG. 13 discloses an alternative embodiment of the present invention as cover 1210. Notably, this cover is disclosed in a grid form with open spaces between grid bars. Unlike other variations of the cover of the present invention, this does not provide a hermetic sealing of the covered space surrounding electrical contacts, but nevertheless provides a covering to protect the electrical contacts from accidental bumping or other contact, human or otherwise, causing deflection and/or damage to the contact. Such grid patterns may take any configuration, including parallel bars, hexagonal grids, or otherwise. Moreover, although most of the covers disclosed are, by way of example, shown with skirt flanges protruding in the Z-axis from a cover plane segment located over the contacts, such skirt segments may be replaced by struts (typically three or more) to maintain the cover away from (typically below) the electrical contacts of the probe card so that the cover does not smash the contacts.

As previously mentioned, various features may be hybridized among the various embodiments disclosed. For example, the key lock mechanism of FIG. 10 may be disclosed with any of the mechanisms for removing the cover, by way of example only, including the mechanisms of FIGS. 3A–3E. Likewise, the connection between the cover and the probe card may be hybridized between any of the examples and/or modified as set forth in the written description. By way of example only, the bayonet mount in FIG. 9B may be utilized with a robotic arm illustrated in FIGS. 4A and 4B.

One optional feature which may be included on any of the previously prescribed embodiments is a sensor for determining and recording information concerning the cover and the probe card. One such sensor would record the date and time the cover was first removed from the probe card. For example, the cover may include a pin engaged with a receptacle on the probe card. When the cover is first removed from the probe card the pin is removed from the receptacle which causes a computer chip located on the probe card to record the date and time.

The second type of sensor would determine the first use of the probe card by recording the date and time the electrical contacts of the probe card first contacted a wafer. For example, a sensor would detect pressure exerted on the electrical contacts and determine the probe card had been used when a force of a particular magnitude is detected. In another example, a sensor may monitor capacitance of the probe card. A particular magnitude change in capacitance would indicate the probe card had engaged a wafer and triggered a recording of the date and time.

A third type of sensor would determine the number of times the electrical contacts of a probe card had engaged the contact elements on a wafer. For example, a pressure sensor may monitor the force exerted on the electrical contacts of the probe card. A force exceeding a predetermined magnitude would indicate a contact with a wafer and cause the event to be recorded on a computer chip.

Of course various combinations of the aforementioned sensors are also contemplated by the present invention. A probe card according to the present invention may incorporate more than one of these sensors or sensors which simultaneously perform more than one recording task. For example, a sensor may determine and record the date and time the contact elements first engaged a wafer card as well as the total number of engagements. The various sensors for recording information concerning the probe card and cover may also be used in combination with other types of sensors not disclosed in this application.

The various covers of the present invention may be made from a variety of material. More commonly, they will be made of a nonconductive anti-static plastic material, typically molded or otherwise formed to shape. As a part of this, the covers may include conductive material or media, a metallic foil and may be made of metal, although not necessarily so, to preferably dissipate static electricity.

Typically, the height of the electrical contacts used in the probe card is approximately 0.040", or about one millimeter. As such, the clearance of the covers exceeds such height in the typical design, but naturally may be modified in accordance with the particular height of a particular probe card contact. The shape, dimensions and proportions to the various features described above may be altered, modified or combined according to design choice in light of the present inventive disclosure.

While the invention has been illustrated and described in detail in the drawings and foregoing description, the same is to be considered as illustrative and not restrictive in character, it being understood that only the preferred embodiment have been shown and described and that all changes and modifications that come within the spirit of the invention are desired to be protected. The articles "a", "an", "said" and "the" are not limited to a singular element, and include one or more such element.

What is claimed is:

1. In combination:

an electronic probe card for testing a die on a wafer;

said probe card having contacts adapted for electrical engagement with said die; and a removable cover connected to said probe card and positionable in a first position over said contacts of said probe card, said cover being movable to a second position exposing said contacts for said engagement with said die; and, wherein said cover is movable from said first position to said second position while said probe card is located in a wafer testing machine, and said cover includes at least one flange member extending toward said probe card and surrounding said contacts, said cover with said flange member and said probe card forming a sealed clean space therein.

2. The combination of claim 1, wherein movement between said first position and said second position is away from said probe card and generally along a Z-axis oriented normal to a plane defined by a bottom surface of said probe card.

3. The combination of claim 1 wherein said cover is attached to said probe card with at least one magnet.

4. The combination of claim 1 wherein said cover is attached to said probe card with at least one bayonet mount.

5. The combination of claim 1 wherein said cover is attached to said probe card with at least one adhesive surface.

6. The combination of claim 1 wherein said cover includes an engagement surface for engaging a holder, said engagement surface including at least one magnet.

7. The combination of claim 1 wherein movement between said first position and said second position is away from said probe card and generally along an X-axis oriented parallel to a plane defined by a bottom surface of said probe card.

8. The combination of claim 1 wherein said cover moves from said first position to said second position along a hinge on said probe card.

9. The combination of claim 1, wherein said cover is not used during testing of said die.

10. The combination of claim 1, wherein said clean space has less than 100 parts per million of particulate matter exceeding one micron in diameter.

11. In combination:

an electronic probe card for testing a die on a wafer;

said probe card having contacts adapted for electrical engagement with said die; and a removable cover connected to said probe card and positionable in a first position over said contacts of said probe card, said cover being movable to a second position exposing said contacts for said engagement with said die, wherein said cover is movable from said first position to said second position while said probe card is located in a wafer testing machine, movement between said first position and said second position is away from said probe card and generally along a Z-axis oriented normal to a plane defined by a bottom surface of said probe card, and said cover includes an engagement surface for engaging a holder, said holder comprising a mechanical member movable within said testing machine to engage and hold said cover and move it to said second position.

12. The combination of claim 11 wherein said mechanical member comprises a robotic element movable generally along said Z-axis and generally along a transverse X-axis.

13. The combination of claim 12 wherein said mechanical member moves along at least one track member generally along said X-axis.

14. The combination of claim 12 wherein said cover is attached to said probe card with at least one magnet.

15. The combination of claim 12 wherein said cover is attached to said probe card with at least one bayonet mount.

16. The combination of claim 12 wherein said cover is attached to said probe card with at least one adhesive surface.

17. The combination of claim 12 wherein said cover includes at least one flange member extending toward said probe card and surrounding said contacts, said cover with said flange member and said probe card forming a sealed space therein, said space comprising a clean space having less than 100 parts per million of particulate matter exceeding one micron in diameter.

18. In combination:
an electronic probe card for testing a die on a wafer;
said probe card having contacts adapted for electrical engagement with said die; and
a removable cover connected to said probe card and positionable in a first position over said contacts of said probe card, said cover being movable to a second position exposing said contacts for said engagement with said die,
wherein said cover is movable from said first position to said second position while said probe card is located in a wafer testing machine, and
said cover includes an engagement surface for engaging a holder, said engagement surface being formed in a recess in said cover, said holder extending into said recess to hold said cover.

19. The combination of claim 18 wherein said cover includes at least one flange member extending toward said probe card and surrounding said contacts, said cover with said flange member and said probe card forming a sealed space therein, said space comprising a clean space having less than 100 parts per million of particulate matter exceeding one micron in diameter.

20. In combination:
an electronic probe card for testing a die on a wafer;
said probe card having contacts adapted for electrical engagement with said die; and
a removable cover connected to said probe card and positionable in a first position over said contacts of said probe card, said cover being movable to a second position exposing said contacts for said engagement with said die,
wherein said cover is movable from said first position to said second position while said probe card is located in a wafer testing machine, and
said cover includes an engagement surface for engaging a holder, said engagement surface including a key-lock recess for receiving said holder.

21. In combination:
an electronic probe card for testing a die on a wafer;
said probe card having contacts adapted for electrical engagement with said die; and
a removable cover connected to said probe card and positionable in a first position over said contacts of said probe card, said cover being movable to a second position exposing said contacts for said engagement with said die,
wherein said cover is movable from said first position to said second position while said probe card is located in a wafer testing machine,
movement between said first position and said second position is away from said probe card and generally along an X-axis oriented parallel to a plane defined by a bottom surface of said probe card, and
said cover moves from said first position to said second position along tracks on said probe card.

22. A method for protecting an electronic probe card for testing die on a wafer, the probe card having contacts adapted for electrical engagement with said die, comprising the acts of:
providing an electronic probe card, for testing a die on a wafer, said probe card having contacts adapted for electrical engagement with the die;
covering said contacts with a cover that creates a sealed space within said cover around the contacts;
mounting said probe card with said cover in a wafer testing machine; and thereafter,
removing said cover from said contacts while said probe card is in said testing machine to expose said contacts for testing the die in said testing machine.

23. The method of claim 22 wherein said removing includes mechanically holding said cover and moving it generally in a Z-axis direction away from the probe card.

24. The method of claim 22 wherein the act of covering the contacts includes the act of maintaining a sealed space within said cover around the contacts with a particulate level less than 100 parts per million of particulate in excess of one micron in diameter.

25. The method of claim 23 wherein the act of moving the cover in said Z-axis direction is preceded by the act of rotating the cover with respect to the probe card to release it therefrom.

26. The method of claim 22, wherein said cover is not used during testing of said die.

27. The method of claim 22, wherein said clean space has a particulate level less than 100 parts per million of particulate in excess of one micron in diameter.

28. A method for protecting an electronic probe card for testing die on a wafer, the probe card having contacts adapted for electrical engagement with said die, comprising the acts of:
providing an electronic probe card for testing a die on a wafer, said probe card having contacts adapted for electrical engagement with the die;
covering said contacts with a cover;
mounting said probe card with said cover in a wafer testing machine; and thereafter,
removing said cover from said contacts while said probe card is in said testing machine to expose said contacts for testing the die in said testing machine,
wherein said removing act is preceded by the act of grabbing said cover with a robotic holder within said testing machine.

29. A covering for an electronic probe card for testing a die on a wafer, the probe card having contacts adapted for electronic engagement with the die semiconductor device, comprising:

a removable cover connectable to said probe card and positionable in a first position over the contacts of the probe card, said cover being movable to a second position exposing said contacts for said engagement with the die; and, means for engaging a holder wherein said cover is movable from said first position to said second position while said probe card is located in a wafer testing machine by having said means for engaging a holder held by a holder in the testing machine.

30. The covering of claim 29 wherein said means for engaging includes a key-lock recess for receiving said holder.

31. The covering of claim 29 wherein said means for engaging includes a magnet.

32. The covering of claim 29 wherein said means for engaging includes at least one recess in said cover adapted to receive a corresponding holding element in a wafer testing machine.

33. The covering of claim 29 and further comprising a bayonet mount on said cover for mounting said cover to the probe card.

34. The covering of claim 29 and further comprising a ferro-magnetic mount on said cover for mounting to a corresponding ferro-magnetic mount on the probe card.

35. The covering of claim 29 wherein said cover includes at least one flange member extendable toward said probe card for surrounding said contacts, said cover with said flange member and said probe card forming a space therein, said space comprising a clean space having less than 100 parts per million of particulate matter exceeding one micron in diameter.

36. A probing apparatus comprising:
a plurality of probes configured to electrically engage a semiconductor device to be tested;
a moveable cover, wherein said cover is moveable between a first position in which said cover covers and protects said probes and a second position in which said probes are exposed for said engagement with said semiconductor device; and
a sensor configured to record information regarding said cover.

37. The probing apparatus of claim 36 further comprising a mounting structure configured to mount said probing apparatus within a testing device, and wherein said cover is moveable between said first position and said second position while said probing apparatus is mounted in said testing device.

38. The probing apparatus of claim 37 wherein said cover is configured to be engaged by a device for moving said cover from said first position to said second position.

39. The probing apparatus of claim 37 wherein:
in said first position, said cover is attached to said probing apparatus, and
in said second position, said cover is detached from said probing apparatus.

40. The probing apparatus of claim 37 wherein said cover is attached to said probing apparatus in said first position and in said second position.

41. The probing apparatus of claim 40 further comprising a hinge attaching said cover to said probing apparatus, and wherein said hinge allows said cover to move between said first position and said second position.

42. The probing apparatus of claim 37, wherein:
said cover comprises a moveable aperture,
said first position of said cover corresponds to said aperture being closed, and
said second position of said cover corresponds to said aperture being open.

43. The probing apparatus of claim 37, wherein in said first position, said cover forms a hermetic seal with said probing apparatus sealing a space around said probes.

44. The probing apparatus of claim 36, wherein said sensor is configured to record information regarding first movement of said cover from said first position to said second position.

45. The probing apparatus if claim 44, wherein said information comprises a date and time of said first movement of said cover from said first position to said second position.

46. The probing apparatus of claim 36, wherein said cover is not used during testing of said die.

47. A method for testing a semiconductor device, said method comprising:
providing a probing apparatus comprising a plurality of probes configured to electrically engage said semiconductor device and a protective cover in a first position in which said cover covers and protects said probes;
mounting said probing apparatus within a testing device, said testing device configured to hold said semiconductor device during said testing;
moving said cover from said first position to a second position in which said probes are exposed for said engagement with said semiconductor device, wherein said step of moving comprises engaging said cover with a holding device and moving said cover from said first position to said second position with said holding device;
bringing said semiconductor device into said electrical engagement with said probes; and
testing said semiconductor device,
wherein said cover is not used to test said semiconductor device.

48. The method of claim 47, wherein said step of moving comprises detaching and removing said cover from said probing apparatus.

49. The method of claim 47, wherein said cover is attached to said probing apparatus in said first position and in said second position.

50. The method of claim 49, wherein said step of moving comprises rotating said cover at a hinge attaching said cover to said probing apparatus.

51. The method of claim 47, wherein in said first position, said cover forms a hermetic seal with said probing apparatus sealing a space around said probes.

52. A method for testing a semiconductor device, said method comprising:
providing a probing apparatus comprising a plurality of probes configured to electrically engage said semiconductor device and a protective cover in a first position in which said cover covers and protects said probes;
mounting said probing apparatus within a testing device, said testing device configured to hold said semiconductor device during said testing;
moving said cover from said first position to a second position in which said probes are exposed for said engagement with said semiconductor device;
bringing said semiconductor device into said electrical engagement with said probes;
testing said semiconductor device; and
sensing and recording information regarding first movement of said cover from said first position to said second position.

53. The method of claim 52, wherein said information comprises a date and time of said first movement of said cover from said first position to said second position.

54. The method of claim 52, wherein said cover is not used during testing of said die.

55. A protective apparatus comprising:

a cover configured to cover and protect a plurality of probes configured to electrically engage a semiconductor device to be tested;

attaching means for moveably attaching said cover to a probing apparatus comprising said plurality of probes, wherein said cover is moveable between a first position in which said cover covers and protects said probes and a second position in which said probes are exposed for said engagement with said semiconductor device, wherein said cover is not used to test said semiconductor device, and said cover is configured to be engaged by a device for moving said cover from said first position to said second position while said probing apparatus is mounted within a testing device.

56. The protective apparatus of claim 55, wherein:

in said first position, said cover is attached to said probing apparatus, and in said second position, said cover is detached from said probing apparatus.

57. The protective apparatus of claim 55, wherein said cover is attached to said probing apparatus in said first position and in said second position.

58. The protective apparatus of claim 55, wherein said attaching means forms a hermetic seal with said probing apparatus sealing a space around said probes while said cover is in said first position.

* * * * *